United States Patent [19]

Stoakley et al.

[11] Patent Number: 5,248,519
[45] Date of Patent: Sep. 28, 1993

[54] PROCESS FOR PREPARING AN ASSEMBLY OF AN ARTICLE AND A SOLUBLE POLYIMIDE WHICH RESISTS DIMENSIONAL CHANGE, DELAMINATION, AND DEBONDING WHEN EXPOSED TO CHANGES IN TEMPERATURE

[75] Inventors: Diane M. Stoakley; Anne K. St. Clair, both of Poquoson, Va.

[73] Assignee: The United States of America as represented by the Administrator of the National Aeronautics and Space Administration, Washington, D.C.

[21] Appl. No.: 736,667

[22] Filed: Jul. 26, 1991

[51] Int. Cl.$^5$ .................. B05D 1/00; B05D 5/06; B05D 5/12
[52] U.S. Cl. ................... 427/96; 427/163; 427/385.5; 427/388.1
[58] Field of Search .............. 427/384, 385.5, 388.1, 427/255.6, 96, 163; 528/322; 524/507

[56] References Cited

U.S. PATENT DOCUMENTS

| | | | |
|---|---|---|---|
| 4,558,117 | 12/1985 | Nakano et al. | 528/184 |
| 4,574,056 | 3/1986 | Kimura | 252/514 |
| 4,996,293 | 2/1991 | Tsuyoshi | 528/352 |
| 5,037,862 | 8/1991 | Nishizawa et al. | 523/223 |
| 5,041,513 | 8/1991 | Okinoshima et al. | 528/10 |

Primary Examiner—Shrive Beck
Assistant Examiner—Bret Chen
Attorney, Agent, or Firm—George F. Helfrich

[57] ABSTRACT

An assembly of an article and a polyimide is prepared. The assembly resists dimensional change, delamination, or debonding when exposed to changes in temperature. An article is provided. A soluble polyimide resin solution having a low coefficient of thermal expansion (CTE) was prepared by dissolving the polyimide in solvent and adding a metal ion-containing additive to the solution. Examples of this additive are: Ho(OOCCH$_3$)$_3$, Er(NPPA)$_3$, TmCl$_3$, and Er(C$_5$H$_7$O$_2$)$_3$. The soluble polyimide resin is combined with the article to form the assembly.

11 Claims, 1 Drawing Sheet

PROCESS FOR PREPARING AN ASSEMBLY OF AN ARTICLE AND A SOLUBLE POLYIMIDE WHICH RESISTS DIMENSIONAL CHANGE, DELAMINATION, AND DEBONDING WHEN EXPOSED TO CHANGES IN TEMPERATURE

ORIGIN OF THE INVENTION

The invention described herein was made by employees of the U.S. Government and may be manufactured and used by or for the Government for governmental purposes without the payment of any royalties thereon or therefor.

CROSS REFERENCE TO RELATED CASES

This application is related to co-pending patent application Ser. No. 07/736,880, filed Jul. 26, 1991, entitled "A Process for Preparing an Assembly of an Article and a Polyimide which resists Dimensional Change, Delamination, and Debonding when Exposed to Changes in Temperature".

BACKGROUND OF THE INVENTION

1. Field of the Invention

This invention relates to soluble polyimides which have a low coefficient of thermal expansion (CTE). More particularly, it relates to the preparation of an assembly of an article and a soluble polyimide which resists dimensional change, delamination, and debonding when exposed to changes in temperature.

2. Description of the Related Art

Polyimides have become widely used as high performance polymers as a result of their excellent thermal stability and toughness. However, polymers in general, including polyimides, have higher CTEs than metals, ceramics, and glasses. Lowering the CTE of polyimides would increase their usefulness for aerospace and electronic applications where dimensional stability is a requirement.

The CTEs of polyimides have been lowered in the past by linearizing the polymer molecular structure or by controlling the orientation of the polyimide film. Numata et al. (*Polymer Engineering and Science*, 28, (4), 906 (1988)) lowered the CTE by synthesizing a linear polyimide. By employing polyimides prepared from pyromellitic dianhydride (PMDA) or 3,3',4,4'-biphenyltetracarboxylic dianhydride (s-BPDA) and aromatic diamines that contain only benzene or pyridine rings in para-positions without flexible linkages, they have synthesized polyimides with CTEs from 20–0.4 ppm/°C. Numata and Miwa (*Polymer*, 30, (60), 1170 (1989)) found that the CTEs of uniaxially stretched polyimide films with rigid and flexible molecular chains were lower than their non-oriented counterparts.

By the present invention, an assembly of an article and a soluble polyimide with a reduced CTE is prepared. The assembly resists dimensional change, delamination, and debonding when exposed to changes in temperature. The CTEs have been lowered by incorporating a metal ion-containing additive into a soluble polyimide. St. Clair et al. (U.S. Pat. No. 4,284,461), Taylor et al. (U.S. Pat. No. 4,311,615) and Stoakley and St. Clair ("Lanthanide-Containing Polyimides" *Recent Advances in Polyimide Science and Technology*, W. D. Weber and M. R. Gupta, Eds., Society of Plastics Engineers, New York, 1987, pp 471–479) used these additives to alter the adhesive, electrical, and magnetic properties of polyimides.

Accordingly, it is the object of the present invention to prepare an assembly of an article and a soluble polyimide which resists dimensional change, delamination, and debonding when exposed to temperature changes by adding a metal ion-containing additive to a soluble polyimide.

Another object of the invention is to reduce the CTE of the polyimide so it more closely matches the CTE of the article by incorporating a metal ion-containing additive into the soluble polyimide.

Other objects and advantages of the invention will become apparent to those skilled in the art upon consideration of the accompanying disclosure.

SUMMARY OF THE INVENTION

An assembly of an article and a polyimide is prepared. The assembly resists dimensional change, delamination, or debonding when exposed to changes in temperature. An article is provided. A polyimide resin having a reduced CTE was prepared by dissolving, for example, XU-218 ® polyimide powder of the structure:

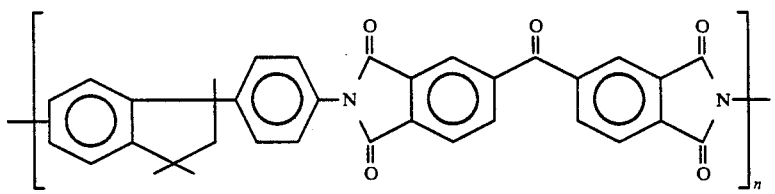

into N,N-dimethylacetamide (DMAc) to which a metal ion-containing additive was added. Examples of this additive are: holmium acetate $Ho(OOCCH_3)_3$, erbium N-phenylphthalamate $Er(NPPA)_3$, thulium chloride $TmCl_3$, and erbium acetylacetonate $Er(C_5H_7O_2)_3$. The resin is combined with the article to form the assembly.

The article selected for the assembly is: a solar concentrator, antennae, solar cell arrays, second surface mirrors, precision solar reflectors, electronic circuit boards, or any other item known to those skilled in the art. A precision solar reflector is the preferred article for this application.

A solution of the soluble polyimide was prepared by dissolving Ciba Geigy's XU-218 ® polyimide powder in chloroform, DMAc or any other suitable organic solvent. A metal ion-containing additive was then added to the solution. Erbium acetylacetonate gave the best results.

An article is either coated with or embedded into the soluble polyimide solution or bonded to a polyimide substrate. In cases where the article is coated with or embedded into the soluble polyimide, heat was used to remove the excess solvent. The solvent was removed by heating the solution to about 100° C.–300° C. The polyimide substrate is formed by casting the soluble polyimide solution into a mold and heating to about 100° C.–300° C. prior to the attachment of an article. The article is bonded to the polyimide substrate with a polyimide-based adhesive or by surface treatment.

DESCRIPTION OF THE PREFERRED EMBODIMENTS

Figure 1:
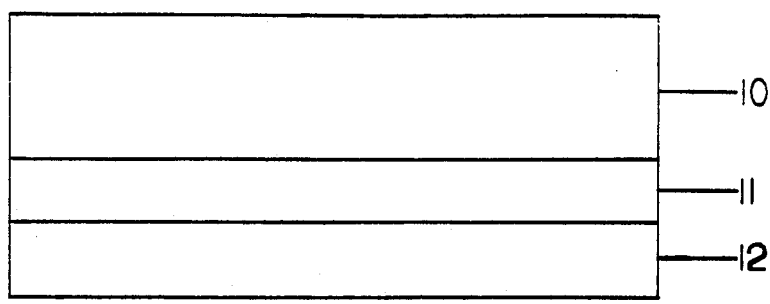
FIG. 1 is a schematic showing a preferred embodiment of the present invention where the low CTE polyimide is used as a substrate.

A polyimide resin solution, which had a low coefficient of thermal expansion (CTE), was prepared at 15% solids. Ciba Geigy's XU-218 ® polyimide powder was dissolved in DMAc to yield a polyimide resin that was 15% solids. A metal ion-containing additive was added at a concentration range of approximately 4–30 weight percent to the polyimide resin.

The metal ion-containing polyimide resin was cast as a film on soda-lime glass plates using a doctor blade set to a wet film thickness of approximately 18 mil. The film was placed in a low humidity box overnight and was then heated in a forced air oven for 1 hour each at 100°, 200°, and 300° C. to effectively remove the DMAc solvent. The film was removed from the glass plate by soaking in water.

Another soluble polyimide was prepared from the reaction of an equimolar quantity of 2,2-bis(3,4-dicarboxyphenyl)hexafluoropropane dianhydride (6FDA) with 1,3-bis(aminophenoxy)benzene (APB) in a polar organic solvent such as N,N-dimethylacetamide (DMAc). Once the polyamic acid was formed, acetic anhydride and pyridine were added to chemically imidize the acid. The polyimide was precipitated, recovered, washed with water, dried, and redissolved in solvent such as DMAc to form the imide solution.

In addition to the soluble polyimides used, other soluble polyimides known to those skilled in the art may also be used in the present invention.

Although DMAc was the solvent used for this application, other solvents such as chloroform, methyl ethyl ketone, and isobutyl ketone could also be used.

The metal ion-containing additives of this invention included: holmium acetate $Ho(OOCCH_3)_3$, erbium N-phenylphthalamate $Er(NPPA)_3$, thulium chloride $TmCl_3$, and erbium acetylacetonate $Er(C_5H_7O_2)_3$. Each additive reduced the CTE and it was found that $Er(C_5H_7O_2)_3$ gave the best results. The data is shown in Table I.

TABLE I

| Coefficients of Thermal Expansion of Metal Ion-Containing Polyimide Films | | | |
|---|---|---|---|
| Additive | % Additive | Tg by TMA, °C. | CTE ppm/°C. |
| XU-218 ® Control | 0.0 | 320 | 46.1 |
| $Ho(OOCCH_3)_3$ | 13.4 | 329 | 34.7 |
| $Er(NPPA)_3$ | 28.6 | 291 | 30.7 |
| $Er(C_5H_7O_2)_3$ | 17.3 | 325 | 28.3 |

A low CTE polyimide substrate is prepared by pouring the soluble polyimide resin into a mold and heating for one hour each at 100°, 200°, and 300° C. to remove the solvent.

An article is provided to form an assembly with the polyimide. Examples of this article are: a solar concentrator, antennae, solar cell arrays, second surface mirrors, precision solar reflectors, or electronic circuit boards. Other articles known to those skilled in the art can also be used. A polyimide solution having a low CTE is prepared. The solution is used to coat the article, to embed the article, or to form a substrate to which the article is attached. For example, a circuit board is coated by either spraying, dipping, or brushing with the polyimide solution. The solution is heated for 1 hour each at 100°, 200°, and 300° C. in a forced air oven to remove the excess solvent. The coated article is resistant to delamination when exposed to temperature changes.

In another example, the polyimide solution is cast into a mold. The circuit board is embedded into the solution prior to heating. After heating, the resulting assembly is resistant to debonding.

As yet another example, an article is attached to a polyimide substrate formed from the polyimide solution. The soluble polyimide is poured into a mold and is heated to remove the excess solvent. The article is attached to the substrate with a polyimide-based adhesive. The resulting assembly is resistant to debonding and delamination when exposed to changes in temperature.

In yet another example, a thin-film assembly for a precision solar reflector is prepared. The soluble polyimide solution containing the metal ion additive is poured onto a glass, metal, or other surface having the shape of the reflector. The resin is spun-cast to 0.5–5.0 mil thickness and heated to produce a low CTE polyimide film. The polyimide film is combined with a reflecting layer and a protective topcoat to form the assembly.

EXAMPLES

Example 1

A solution of XU-218 ® in DMAc was prepared by dissolving 1.66 g of XU-218 ® polyimide powder into 9.40 g DMAc to yield a polyimide resin that was 15% solids. A film was cast that was 18 mil wet and left in a low humidity film box overnight. The film was heated in a forced air oven for 1 hour each at 100° C., 200° C., and 300° C. to effectively remove the DMAc solvent. The resulting XU-218 ® control film was a transparent yellow film with a Tg of 326° C. and CTE of 46.1 ppm/° C. An XU-218 ® solution was prepared as described above to which 0.257 g (0.00075 moles) $Ho(OOCCH_3)_3$ was added and stirred for several hours. A film was cast and cured as in the case of the control film. The resulting 1:4 $Ho(OOCCH_3)_3$:XU-218 ® film had a Tg of 329° C. and CTE of 34.7 ppm/° C.

Example 2

An XU-218 ® solution was prepared by the process of Example 1 but the heating schedule was altered to 1 hour at 100° C., 1-½ hours at 200° C., and 2 hours at 250° C. The resulting transparent yellow control film had a Tg of 320° C. and a CTE of 46.1 ppm/° C. An XU-218 ® solution was prepared by the process of Example 1 to which 0.665 g (0.00075 moles) $Er(NPPA)_3$ was added and stirred for several hours. A film was cast and heated by the process above. The resulting 1:4 Er(NPPA)$_3$:XU-218® film was transparent yellow and had a Tg of 291° C. and CTE of 30.7 ppm/° C.

Example 3

The process of Example 2 was repeated using 0.348 g (0.00075 moles) Er(C$_5$H$_7$O$_2$)$_3$. The resulting 1:4 Er(C$_5$H$_7$O$_2$)$_3$:XU-218® film was transparent amber and had a Tg of 325° C. and CTE of 28.3 ppm/° C.

Example 4

Figure 2:
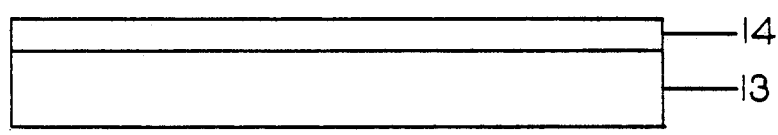
FIG. 2 is a schematic showing an article which is coated with a low CTE polyimide to form an assembly.

A circuit board 13 (of FIG. 2) is coated with a low CTE polyimide resin solution 14 (of FIG. 2) as in Example 1. The coating is applied to the circuit board by spraying, brushing, dipping, or any other method known to those skilled in the art. The solvent is removed by heating for 1 hour each at 100° C., 200° C., and 300° C. in a forced air oven. The coated article is resistant to delamination when exposed to changes in temperature.

Example 5

Figure 3:
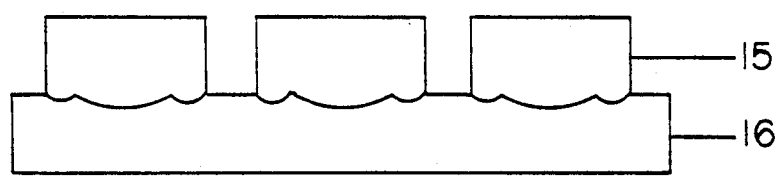
FIG. 3 is a schematic showing the formation of an assembly by embedding an article into the low CTE polyimide.

An article 15 (of FIG. 3) is attached to a low CTE polyimide substrate prepared from the soluble polyimide solution as in Example 1. The solution is poured into a mold and the article is embedded 16 (of FIG. 3) in the solution. The assembly is heated for 1 hour each at 100° C., 200° C., and 300° C. in a forced air oven to remove the solvent. The article is resistant to debonding when exposed to changes in temperature.

Example 6

Figure 4:
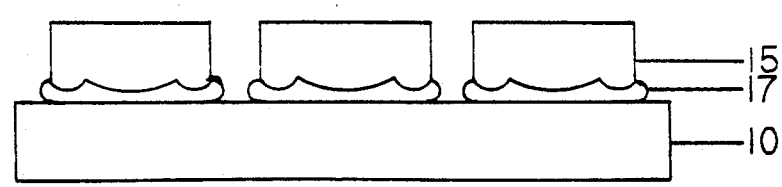
FIG. 4 is a schematic showing an article attached to a low CTE polyimide substrate with an adhesive.

An article 15 (of FIG. 4) is attached to a low CTE polyimide substrate prepared from the soluble polyimide solution 10 (of FIG. 4) as in Example 1. The solution is poured into a mold and is heated for 1 hour each at 100° C., 200° C., and 300° C. in a forced air oven to remove the solvent. The article is attached to the substrate by bonding it with an adhesive 17 (of FIG. 4). The article is resistant to debonding when exposed to changes in temperature.

Example 7

A thin-film assembly for a precision solar reflector is prepared (FIG. 1). A soluble polyimide resin solution as in Example 1 was prepared. The solution is poured onto a glass, metal, or other surface which has the shape of the reflector. The solution is spun-cast to a thickness of 0.5-5.0 mils and heated to 100°-300° C. in a forced air oven. The resulting substrate 10 (of FIG. 1) is removed from the surface and is metallized with a highly reflecting metal layer 11 (of FIG. 1) such as silver, aluminum, or chromium. The metal layer is applied at a thickness between 10 and 2000 Å using a surface treatment such as vapor deposition or sputtering. A clear protective topcoat 12 (of FIG. 1) is applied at 0.1-1.0 mil thickness to prevent tarnishing. The layers of the assembly are resistant to dimensional change, debonding, or delamination upon exposure to changes in temperature.

Example 8

A low CTE soluble polyimide was prepared by reacting an equimolar quantity of APB and 6FDA in DMAc. Acetic anhydride and pyridine are added to the resulting polyamic acid solution. The polyimide precipitate was recovered, washed with water, and dried. The imide powder was dissolved in DMAc to form a solution and TmCl$_3$ was added at a concentration of 1:5 TmCl$_3$:APB/6FDA. The solution was cast on a glass plate and was placed in a low humidity film box overnight and heated to effectively remove the DMAc solvent. The resulting film had a CTE of 38.4 ppm/° C. as compared to the control film of 51.0 ppm/° C.

The above examples are considered to be illustrative of the invention and there may be modifications and variations in the metal ion-containing additive, the soluble polyimide, or the article that will be apparent to those skilled in the art without departing from the spirit and scope of the invention as set forth herein. It is therefore to be understood that the invention may be practiced otherwise than as specifically described and claimed herein.

What is claimed to be new and desired to be secured by Letters Patent of the United States is:

1. A process for preparing an assembly of an article and a polyimide which resists dimensional change, delamination, and debonding when exposed to temperature changes, the process comprising:
   a. providing an article;
   b. preparing a solution of a soluble polyimide resin with a reduced coefficient of thermal expansion by dissolving a soluble polyimide resin in a solvent selected from the group consisting of N,N-dimethylacetamide (DMAc), chloroform, methyl ethyl ketone, and isobutyl ketone to make said solution;
   c. adding a metal ion-containing additive selected from the group consisting of Ho(OOCCH$_3$)$_3$, Er(NPPA)$_3$, TmCl$_3$, and Er(C$_5$H$_7$O$_2$)$_3$ to form a metal ion-containing solution; and
   d. heating the said metal ion-containing solution and combining it with the article to form the assembly.

2. The process of claim 1, wherein said article is selected from the group consisting of solar concentrators, antenna, solar cell arrays, second surface mirrors, precision solar reflectors, and electronic circuit boards.

3. The process of claim 2, wherein said article is a precision solar reflector.

4. The process of claim 1, wherein the concentration of said soluble polyimide resin is about 10-15 weight percent of the said metal ion-containing solution.

5. The process of claim 1, wherein said polyimide has the repeat unit:

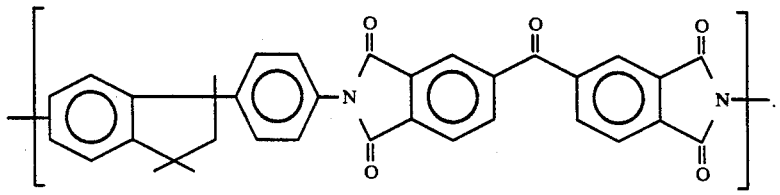

6. The process of claim 1, wherein said solvent is selected from the group consisting of N,N-dimethylacetamide, N,N-dimethylformamide, N-methyl-2- pyrrolidone, dimethylsulfoxide, and bis(2-methoxyethyl)ether.

7. The process of claim 6, wherein said solvent is N,N-dimethylacetamide.

8. The process of claim 1, wherein the concentration of said metal ion-containing additive is 4–30 weight percent of the said metal ion-containing solution.

9. The process of claim 1, wherein said metal ion-containing additive is $Er(C_5H_7O_2)_3$.

10. The process of claim 1, wherein said metal ion-containing solution is used to coat the article prior to heating for solvent removal.

11. The process of claim 1, wherein said soluble polyimide resin is made from 2,2-bis(3,4-dicarboxyphenyl)-hexafluoropropane dianhydride and 1,3-bis(aminophenoxy)benzene.

* * * * *